(12) United States Patent
Chen et al.

(10) Patent No.: US 7,026,012 B2
(45) Date of Patent: Apr. 11, 2006

(54) METHOD AND APPARATUS FOR FORMING A METALLIC FEATURE ON A SUBSTRATE

(75) Inventors: William T. Chen, Endicott, NY (US); Peter M. Moran, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 427 days.

(21) Appl. No.: 10/081,768

(22) Filed: Feb. 22, 2002

(65) Prior Publication Data

US 2002/0119251 A1 Aug. 29, 2002

(30) Foreign Application Priority Data

Feb. 23, 2001 (SG) ..................................... 200101072-7

(51) Int. Cl.
*B05D 3/10* (2006.01)
*B05D 1/36* (2006.01)
*B05D 5/00* (2006.01)
*B05D 1/18* (2006.01)
*B05D 3/02* (2006.01)

(52) U.S. Cl. .................. 427/304; 427/305; 427/306; 427/316; 427/271; 427/430.1; 427/404; 427/443.1

(58) Field of Classification Search .............. 427/304, 427/305, 306, 316, 271, 430.1, 404, 443.1
See application file for complete search history.

(56) References Cited

U.S. PATENT DOCUMENTS 6,060,121 A * 5/2000 Hidber et al. ............... 427/261

OTHER PUBLICATIONS

Boonekamp et al., "Adsorption of Nanometer–Sized Palladium Particles on Si(100) Surfaces", Langmuir, 10, American Chemical Society, 1994, ppgs. 4089–4094.*

Boonekamp et al., Adsorption of Nanometer–Sized Palladium Particles on Si(100) Surfaces, 10 Langmuir 4089–4094 (American Chemical Society, 1994).

Hidber et al., Microcontact Printing of Palladium Colloids: Micron–Scale Patterning by Electroless Deposition of Copper, 12 Langmuir 1375–80 (American Chemical Society, 1996).

Hidber et al., New Strategy for Controlling the Size and Shape of Metallic Features Formed by Electroless Deposition of Copper: Microcontact Printing of Catalysts on Oriented Polymers, Followed by Thermal Shrinkage, 12 Langmuir 5209–5215 (American Chemical Society, 1996).

* cited by examiner

Primary Examiner—Michael Barr
(74) Attorney, Agent, or Firm—Workman Nydegger

(57) ABSTRACT

A method of forming a metallic feature on a substrate, comprising the steps of: providing a stamp having a raised region; depositing catalytic particles on a selected area of the stamp, including the raised region thereof; providing a substrate; applying the stamp to the substrate, such that the raised region of the stamp causes a corresponding indented region in the substrate and at least some of the catalytic particles are transferred to a selected area of the substrate; and plating the selected area of the substrate.

63 Claims, 5 Drawing Sheets

METHOD AND APPARATUS FOR FORMING A METALLIC FEATURE ON A SUBSTRATE

This application claims priority to Singapore Application serial No. 200101072-7, filed Feb. 23, 2001, which is hereby incorporated by reference in its entirety.

FIELD OF THE INVENTION

This invention relates to a method and apparatus for forming a metallic feature on a substrate, and in particular to a method and apparatus for forming fine metallic features in close proximity to one another on a substrate.

BACKGROUND OF THE INVENTION

The formation of fine metallic features in close proximity to one another is of great commercial interest in several industries, most notably the printed circuit board (PCB), flexible circuit and packaging industries. The formation of smaller, more densely arranged components on the surface of a substrate allows the manufacture of PCB's that are cheap and operate quickly (due to the proximity of the components), and for flip chip applications the packaging industry requires the accurate patterning of solder bumps onto PCB's for connection to chips.

Many conventional methods of forming metallic features on substrates involve the use of photolithography to define a pattern on the substrate. However, this technique is cumbersome and expensive, and the size the of metallic features that can be produced thereby on, for example, PCB's is limited to around 30 µm and above. Moreover, the controlled formation of three-dimensional features (i.e. those which are raised above the surface of the substrate) is difficult using such conventional methods.

More recent techniques comprise the application of catalytic particles to the surface of a substrate by a soft stamp, the particles being applied in a pattern which corresponds to the metallic features that are to be created on the surface of the substrate. Prior to stamping, the substrate must first be activated by oxidation and/or silanization in order to ensure the particles will adhere to it. During subsequent electroless plating of the substrate, metal will only plate to the substrate where catalytic particles have been deposited. In this manner, small-scale metallic surface features can be created.

However, one drawback of this process is that the depth of the metallic features is limited by the amount of metal that can be deposited on a region of a substrate containing catalytic particles before lateral spreading of the metal takes place. This clearly places an upper limit both on the density of surface features that can be created using this technique and on the minimum distance between any two features.

A further drawback of this technique is that the oxidation and silanization steps are lengthy. Furthermore, since these surface treatments form a very thin (nanometer-sized) active layer on the surface, any moulding or deformation of the substrate during the stamping process is not practical. This precludes using the existing method for moulding non-planar circuitry during the stamping process. The stamping process using the previously described technique is also slow.

SUMMARY OF THE INVENTION

It is an object of the present invention to seek to provide a method and apparatus for forming metallic features on a substrate that alleviate some or all of the above drawbacks.

Accordingly, one aspect of the present invention provides a method of forming a metallic feature on a substrate, comprising the steps of: providing a stamp having a raised region; depositing catalytic particles on a selected area of the stamp, including the raised region thereof; providing a substrate; applying the stamp to the substrate, such that the raised region of the stamp causes a corresponding indented region in the substrate and at least some of the catalytic particles are transferred to a selected area of the substrate; and plating the selected area of the substrate.

Advantageously, the step of depositing catalytic particles on the selected area of the stamp comprises the step of immersing at least the selected area of the stamp in a suspension comprising the catalytic particles.

Preferably, the step of immersing at least the selected area of the stamp in a suspension comprising the catalytic particles comprises the step of immersing at least the selected area of the stamp in an aqueous suspension comprising the catalytic particles.

Conveniently, the method further comprises the step of drying at least the selected area of the stamp, after immersion thereof in the suspension.

Advantageously, the step of drying at least the selected area of the stamp comprises the step of blow drying at least the selected area of the stamp with a gas.

Preferably, the step of blow drying at least the selected area with a gas comprises the step of blow drying the selected area with nitrogen, helium or air.

Conveniently, the step of depositing catalytic particles on the selected area of the stamp comprises the step of depositing polymer-stabilised catalytic particles on the selected area of the stamp.

Advantageously, the step of depositing polymer-stabilised catalytic particles on the selected area of the stamp comprises the step of depositing catalytic particles stabilised by polyvinylpyrrolidone, poly-2-vinylpyridine or polyvinyl alcohol on the selected area of the stamp Preferably, the step of providing a substrate comprises the step of providing a substrate formed from a glass or a metal.

Conveniently, the step of providing a substrate comprises the step of providing a polymeric substrate.

Advantageously, the step of providing a polymeric substrate comprises the step of providing a substrate formed from a polystyrene, a polyimide, an acrylic or an epoxy.

Preferably, the step of applying the stamp to the substrate further comprises the step of heating at least one of the stamp or the substrate.

Conveniently, the step of heating at least one of the stamp or the substrate comprises the step of heating one of the stamp or the substrate to around or above the glass transition temperature of the substrate.

Advantageously, the method further comprises the step of modifying at least the selected area of the substrate to facilitate the deposition of the catalytic particles thereon.

Preferably, the step of modifying at least the selected area of the substrate comprises the step of chemically modifying the selected area of the substrate.

Conveniently, the step of chemically modifying at least the selected area of the substrate comprises the step of silanising at least the selected area of the substrate.

Advantageously, the method further comprises the step of removing some of the catalytic particles from the stamp.

Preferably, the step of removing some of the catalytic particles from the stamp comprises the steps of: applying an adhesive surface to the stamp; and subsequently removing the adhesive surface from the stamp.

Conveniently, the step of depositing catalytic particles on the selected area of the stamp comprises the step of depositing palladium-based catalytic particles on the selected area of the stamp.

Another aspect of the present invention provides a method of forming a metallic feature on a substrate, comprising the steps of: providing a mould, an inner surface thereof having a raised region, depositing catalytic particles on a selected area of the inner surface of the mould, including the raised region thereof; providing a substrate material; moulding the substrate material within the mould, such that a resulting substrate has an indented region corresponding to the raised region of the inner surface of the mould and at least some of the catalytic particles are transferred to a selected area of the substrate; and plating the selected area of the substrate.

Advantageously, the step of depositing catalytic particles on the selected area of the inner surface of the mould comprises the step of immersing at least the selected area of the inner surface of the mould in a suspension comprising the catalytic particles.

Preferably, the step of immersing at least the selected area of the inner surface of the mould in a suspension comprising the catalytic particles comprises the step of immersing at least the selected area of the inner surface of the mould in an aqueous suspension comprising the catalytic particles.

Conveniently, the method further comprises the step of drying at least the selected area of the mould, after immersion thereof in the suspension.

Advantageously, the step of drying at least the selected area of the mould comprises the step of blow drying at least the selected area of the mould with a gas.

Preferably, the step of blow drying the selected area with a gas comprises the step of blow drying the selected area with nitrogen, helium or air.

Conveniently, the step of depositing catalytic particles on the selected area of the inner surface of the mould comprises the step of depositing polymer-stabilised catalytic particles on the selected area of the inner surface of the mould.

Advantageously, the step of depositing polymer-stabilised catalytic particles on the selected area of the inner surface of the mould comprises the step of depositing catalytic particles stabilised by polyvinylpyrrolidone, poly-2-vinylpyridine or polyvinyl alcohol on the selected area of the inner surface of the mould.

Preferably, the step of providing a substrate material comprises the step of providing a glass or metal substrate material.

Conveniently, the step of providing a substrate material comprises the step of providing a polymeric substrate material.

Advantageously, the step of providing a polymeric substrate material comprises the step of providing a substrate formed from a polystyrene, a polyimide, an acrylic or an epoxy.

Preferably, the step of providing a polymeric substrate material comprises the step of providing a thermoset substrate material, and wherein the step of moulding the substrate material comprises the steps of: moulding the substrate material in an uncured or partially cured state; and curing the substrate material in the mould.

Conveniently, the step of providing a polymeric substrate material comprises the step of providing a thermoplastic substrate material, and wherein the step of moulding the substrate material comprises the step of heating the substrate material to around or above the glass transition temperature thereof.

Advantageously, the method further comprises the step of removing some of the catalytic particles from the inner surface of the mould.

Preferably, the step of removing some of the catalytic particles from the inner surface of the mould comprises the steps of: applying an adhesive surface to the inner surface of the mould, and subsequently removing the adhesive surface from the inner surface of the mould.

Conveniently, the step of depositing catalytic particles on the selected area of the inner surface of the mould comprises the step of depositing palladium-based catalytic particles on the inner surface of the mould.

A further aspect of the present invention provides a method of forming a metallic feature on a substrate, comprising the steps of: providing a stamp; depositing polymer-stabilised catalytic particles on a selected area of the stamp; providing a substrate; applying the stamp to the substrate such that at least some of the polymer-stabilised catalytic particles are transferred to a selected area of the substrate; and plating the selected area of the substrate.

Advantageously, the step of depositing polymer-stabilised catalytic particles on the selected area of the stamp comprises the step of depositing catalytic particles stabilised by polyvinylpyrrolidone, poly-2-vinylpyridine or polyvinyl alcohol on the selected area of the stamp Preferably, the selected area of the stamp comprises a raised region of the stamp.

Conveniently, the step of applying the stamp to the substrate comprises the step of pressing the stamp and the substrate against one another such that the raised region of the stamp causes a corresponding indented region in the substrate.

Advantageously, the step of depositing polymer-stabilised catalytic particles on the selected area of the stamp comprises the step of immersing at least the selected area of the stamp in a suspension comprising the polymer-stabilised catalytic particles.

Preferably, the step of immersing at least the selected area of the stamp in a suspension comprising the polymer-stabilised catalytic particles comprises the step of immersing at least the selected area of the stamp in an aqueous suspension comprising the polymer-stabilised catalytic particles.

Conveniently, the method further comprises the step of drying at least the selected area of the stamp, after immersion thereof in the suspension.

Advantageously, the step of drying at least the selected area of the stamp comprises the step of blow drying at least the selected area of the stamp with a gas.

Preferably, the step of blow drying at least the selected area of the stamp with a gas comprises the step of blow drying the selected area with nitrogen, helium or air.

Conveniently, the step of providing a substrate comprises the step of providing a glass or metal substrate.

Advantageously, the step of providing a substrate comprises the step of providing a polymeric substrate.

Preferably, the step of providing a polymeric substrate comprises the step of providing a substrate formed from a polystyrene, a polyimide, an acrylic or an epoxy.

Conveniently, the step of applying the stamp to the substrate further comprises the step of heating at least one of the stamp or the substrate. Advantageously, the step of heating at least one of the stamp or the substrate comprises the step of heating at least one of the stamp or the substrate to around or above the glass transition temperature of the substrate.

Preferably, the method further comprises the step of modifying at least the selected area of the substrate to facilitate the position of the polymer-stabilised catalytic particles thereon.

Conveniently, the step of modifying at least the selected area of the substrate comprises the step of chemically modifying at least the selected area of the substrate.

Advantageously, the step of chemically modifying at least the selected area of the substrate comprises the step of silanising at least the selected area of the substrate.

Preferably, the method further comprises the step of removing some of the polymer-stabilised catalytic particles from the stamp prior to the application thereof to the substrate.

Conveniently, the step of removing some of the polymer-stabilised catalytic particles from the stamp comprises the steps of: applying an adhesive surface to the stamp; and subsequently removing the adhesive surface from the stamp.

Advantageously, the step of applying an adhesive surface to the stamp comprises the step of applying a patterned adhesive surface to the stamp.

Preferably, the step of depositing polymer-stabilised catalytic particles on the selected area of the stamp comprises the step of depositing palladium-based polymer-stabilised catalytic particles on the selected area of the stamp.

Another aspect of the present invention provides a stamp for application to a substrate, having a selected area comprising a raised region on a surface thereof and at least the selected area of the surface having catalytic particles deposited thereon.

Conveniently, the catalytic particles are polymer-stabilised catalytic particles.

A further aspect of the present invention provides a stamp for application to a substrate, comprising polymer-stabilised catalytic particles deposited on a selected area of a surface thereof.

Advantageously, the selected area of the surface of the stamp comprises at least one raised region.

Another aspect of the present invention provides an apparatus for preparing a substrate, comprising: a stamp according to the above; and means to apply the stamp to a substrate.

Preferably, the apparatus further comprises means to selectively remove some of the catalytic particles from the stamp.

Conveniently, the apparatus further comprises means to plate the substrate.

Advantageously, the means to plate the substrate comprise means to electroless plate or immersion plate the substrate

BRIEF DESCRIPTION OF THE DRAWINGS

In order that the present invention may be more readily understood, embodiments thereof will now be described, by way of example, with reference to the accompanying drawings, in which.

DETAILED DESCRIPTION OF THE PREFERRED EMBODIMENTS

Figure 1:
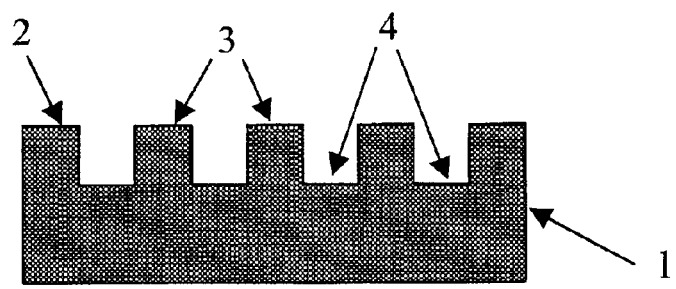
FIG. 1 shows a cross-sectional view of a stamp.

Turning firstly to FIG. 1, a stamp 1 is shown. The stamp 1 may be formed from silicon, or may be formed from any other suitable material such as glass, a metal or a polymer. A stamping surface 2 of the stamp 1 is formed to have raised regions 3 thereon, there being sunken channels 4 between the raised regions 3. The pattern of raised regions 3 corresponds to a pattern of metallic features that are to be formed on a substrate.

Figure 2:
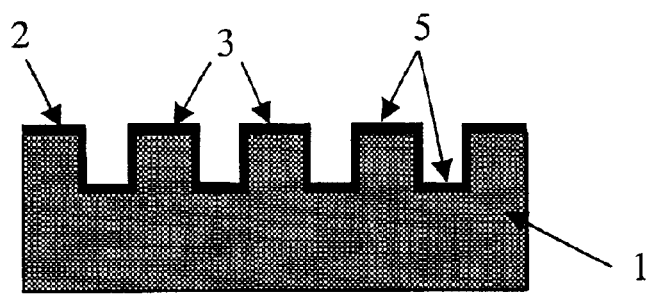
FIG. 2 shows a cross-sectional view of the stamp of FIG. 1, with catalytic particles deposited thereon, embodying the present invention.

In a first step of a method embodying the present invention, the stamping surface 2 of the stamp 1 is coated with a layer of catalytic particles 5, as shown in FIG. 2. The stamp 1 now embodies the present invention. In a preferred embodiment, the catalytic particles 5 comprise nanometer-sized palladium particles. Advantageously, the catalytic particles 5 are coated with molecules of polyvinylpyrrolidone, poly-2-vinylpyridine or polyvinyl alcohol, which coating confers the beneficial effect of stabilising the colloidal suspension of the catalytic particles 5 against agglomeration.

The layer of catalytic particles 5 is deposited on the stamping surface 2 of the stamp 1 by immersion of the stamp 1 in a suspension of the catalytic particles 5. The catalytic particles 5 are adsorbed weakly to the stamping surface 2 of the stamp 1. After immersion in the suspension the stamp 1 is removed from the suspension and blown dry with a gas, such as nitrogen, helium or air. Immersion of the stamp 1 in the suspension may take place for a few seconds, or longer (e.g., several minutes or tens of minutes), as required. It may also be done repeatedly with a drying step in between, if required.

Figure 3:
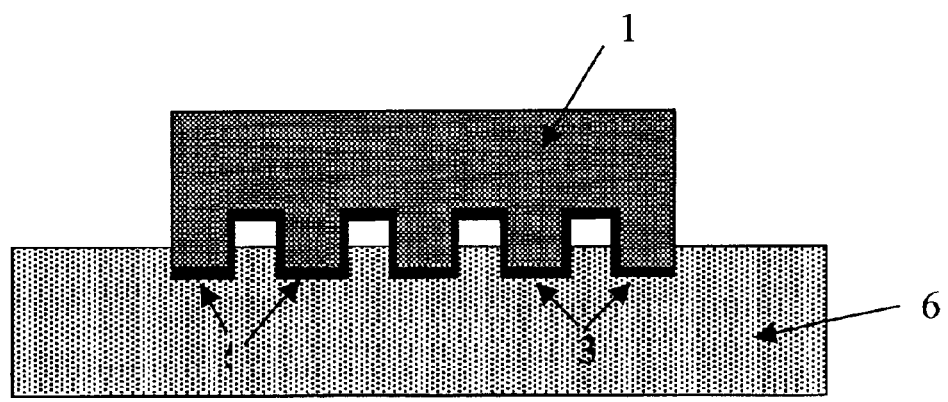
FIG. 3 shows a cross-sectional view of the stamp of FIG. 2 being applied to a substrate.

In a subsequent step of the method of the present invention, the stamp 1 is pressed against a surface of a substrate 6, the stamping surface 2 of the stamp 1 being placed in contact with the substrate 6. This step is shown in FIG. 3. The stamp 1 is pressed against the substrate 6 sufficiently forcefully that the raised regions 3 on the stamping surface 2 of the stamp 1 form corresponding indented regions 7 in the surface of the substrate 6, but not so forcefully that the sunken regions 4 of the stamping surface 2 come into contact with the surface of the substrate 6.

Advantageously, the substrate 6 is a polymeric substrate. In a preferred embodiment of the invention, the substrate 6 is formed from a thermoplastic material, and the stamp 1 is heated to around or above the glass transition temperature of the substrate material before or during application of the stamp 1 to the substrate 6. The material of the substrate 6 is selected to be sufficiently soft (or to become sufficiently soft on heating) that formation of the indented regions 7 by the raised regions 3 of the stamp 1 occurs readily.

Alternatively, the substrate 6 is formed from a partially cured thermoset polymer, and the substrate 6 is cured during or after the stamping process.

Figure 4:
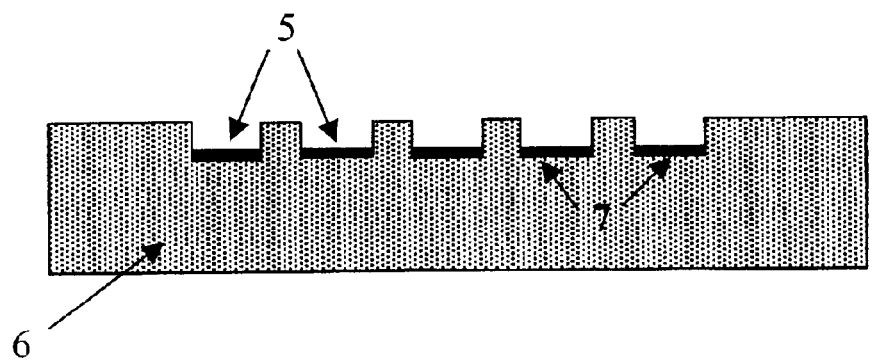
FIG. 4 shows a cross-sectional view of the substrate of FIG. 3 after application thereto of the stamp of FIG. 2.

During the application of the stamp 1 to the substrate 6, the substrate 6 forms either direct or indirect bonds with the catalytic particles 5 on the stamping surface 2 of the stamp 1. These bonds are stronger than those between the catalytic particles 5 and the stamping surface 2 of the stamp 1. Hence, when the stamp 1 is removed from the substrate 6, many of the catalytic particles 5 remain in the indented regions 7 of the surface of the substrate 6, as shown in FIG. 4.

In a preferred embodiment of the present invention, the surface of the substrate 6 is modified to facilitate the deposition of the catalytic particles 5 thereon. Such modification may be chemical (for instance, silanising of the substrate surface), and a skilled person will appreciate that there are several ways in which the substrate surface may be advantageously modified.

The substrate 6 is now ready for plating. The plating may be electroless plating, or may be performed by any other suitable method, for example immersion plating. The catalytic particles 5 perform as activators for the plating. Consequently, when the substrate 6 is plated, plating occurs only where the catalytic particles 5 are present on the surface of the substrate 6. It will be clear that, since the catalytic particles 5 are present only in the indented regions 7 of the surface of the substrate 6, metalisation of the surface of the substrate 6 during the plating process will only occur in the indented regions 7 thereof.

Figure 5:
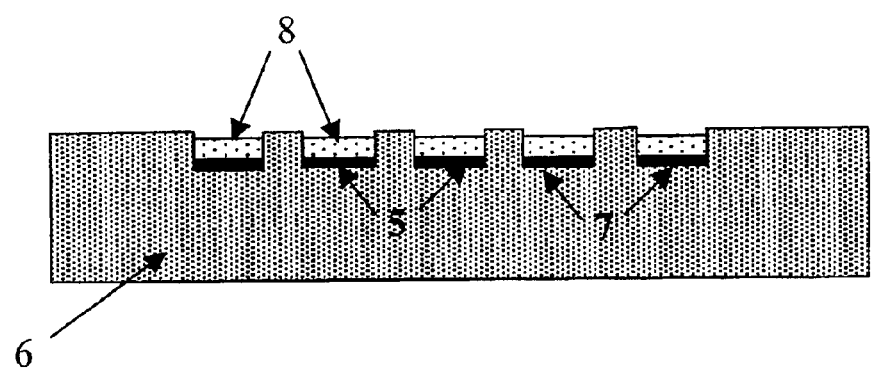
FIG. 5 shows a cross-sectional view of the substrate of FIG. 4 following metalisation thereof.

This means that, as metalisation of the surface of the substrate 6 progresses, the deposited metal will be contained within the walls formed by the non-indented regions of the surface of the substrate 6, and no lateral progress of the deposited metal across the surface of the substrate 6 will be possible. FIG. 5 shows the substrate 6 after metalisation thereof, and it can be seen that the deposited metal 8 is restricted to the indented regions 7 of the surface of the substrate 6.

It will be appreciated that the above method allows the formation of metallic features on the surface of a substrate very close to one another, with very little possibility of the metallic features interfering with one another, due to the presence of the walls of substance material therebetween.

In addition, the metallic features can be of relatively great depth, and the width of the features is independent of this depth, allowing greater control over the exact dimensions of the metallic features.

In another embodiment of the present invention, the catalytic particles 5 may be selectively removed from the surface of a stamp prior to the application of the stamp to the substrate. An example of this is shown in FIGS. 6 to 9.

Figure 6:
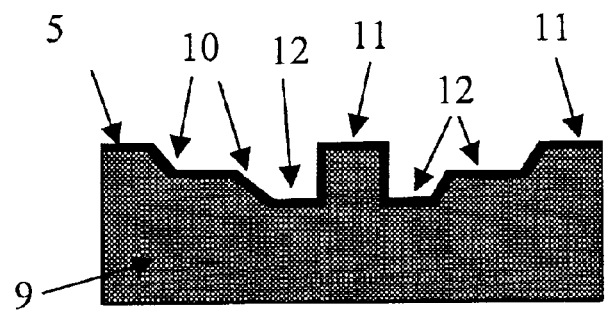
FIG. 6 shows a cross-sectional view of a further stamp embodying the present invention.

FIG. 6 shows a further stamp 9, which has a stamping surface 10 which is patterned to have raised regions 11 with sunken regions 12 therebetween. The stamping surface 10 of the further stamp 9 is coated with catalytic particles 5, as described above.

Figure 7:
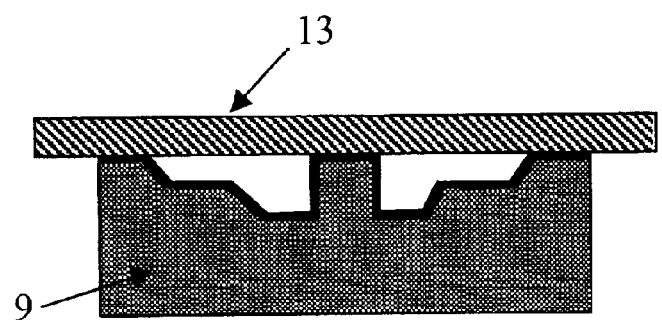
FIG. 7 shows a cross-sectional view of the stamp of FIG. 6, with a length of adhesive tape applied thereto.

Prior to the application of the further stamp 9 to a substrate, a layer of adhesive tape 13 is placed over the stamping surface 10 of the further stamp 9, as shown in FIG. 7. The catalytic particles 5 deposited on the raised regions 11 of the stamping surface 10 of the further stamp 9 will come into contact with the adhesive tape 13. However, the catalytic particles in the sunken regions 12 of the stamping surface 10 of the further stamp 9 do not come into contact with the adhesive tape 13.

Figure 8:
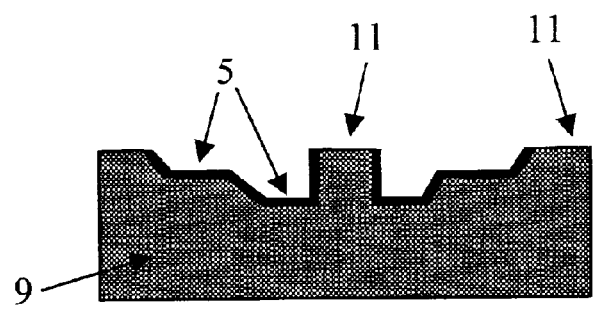
FIG. 8 shows a cross-sectional view of the stamp of FIG. 7, after removal of the adhesive tape.

The adhesive tape 13 is subsequently removed from the stamping surface 10 of the further stamp 9, and the catalytic particles 5 with which the adhesive tape 13 was in contact are also removed. Hence, as shown in FIG. 8, the raised regions 11 of the further stamp 9 have no catalytic particles 5 thereon, but the sunken regions 12 of the further stamp 9 have catalytic particles 5 adhered thereto.

Figure 9:
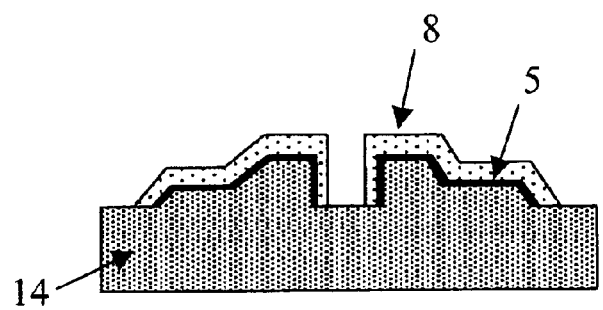
FIG. 9 shows a cross-sectional view of a further substrate, following application of the further stamp thereto and metalisation thereof.

The further stamp 9 is then applied to a further substrate 14. However, in contrast to the above-described application of the stamp 1 to the substrate 6, the further stamp 9 is pressed against the further substrate 14 with sufficient force for the entirety of the stamping surface 10 of the further stamp 9, including the sunken regions 12 thereof, to come into contact with the surface of the further substrate 14. Once the further stamp 9 is removed from the further substrate 14, catalytic particles 5 are only bonded to the further substrate 14 in regions thereof corresponding to the sunken regions 12 of the further stamp 9, as shown in FIG. 9.

It will be appreciated that the selective removal of catalytic particles 5 from the surface of a stamp prior to application thereof to a substrate allows corresponding selective metalisation of the substrate during subsequent electroplating.

The above example also illustrates how the method of the present invention may be employed to create metallic features that protrude above the surface of a substrate. After application of the further stamp 9 to the further substrate 14, the surface of the further substrate 14 will comprise peaks (corresponding to the sunken regions 12 of the further stamp 9) and troughs (corresponding to the raised regions 11 of the further stamp 9). The peaks will be metallised. Hence, metallic features that protrude above the surface of the further substrate 14 may be created. The finely-controlled formation of such features as provided by embodiments of the present invention is useful in, for example, the provision of bumps on a PCB for connection to a chip.

In an alternative embodiment of the present invention, the stamp 1 or the further stamp 9 is provided as part of a mould, to be used in an injection or compression moulding process. Liquid substrate material is placed in the mould, and upon hardening of the substrate material a substrate having a surface with indented regions 7 corresponding to the raised regions 3, 11 on the stamping surface 2, 10 of the stamp 1 or the further stamp 9 is formed.

It will be appreciated that this method of forming a substrate may be employed with a wide variety of substrate materials. For instance, if the substrate material is a thermoset polymer, the substrate material is preferably moulded in an uncured or partially cured state and cured whilst in the mould. In contrast, if the substrate material is a thermoplastic polymer, the substrate material is preferably heated to above the glass transition temperature thereof and cooled in the mould as known in the art.

In another aspect, the present invention involves the use of polymer-stabilised catalytic particles. Known methods employ catalytic particles that are stabilised by surfactants, for example tetraoctadecylammonium bromide in toluene.

The use of polymer-stabilised catalytic particles, however, allows stamping to be done without any surface treatment of the substrate being necessary. This is important as it allows the substrate to be significantly deformed during stamping or moulding. Consequently, non-planar surfaces and conformal circuitry can be formed during the stamping process. In addition, the present method and apparatus allow the particles to weakly adhere to a stamp within seconds, thus expediting the preparation of the stamp and reducing manufacturing time. Examples of suitable polymers that may be used to stabilise catalytic particles include polyvinylpyrrolidone, poly-2-vinylpyridine and polyvinyl alcohol. However, the present invention is not limited to these specific polymers.

Figure 10:
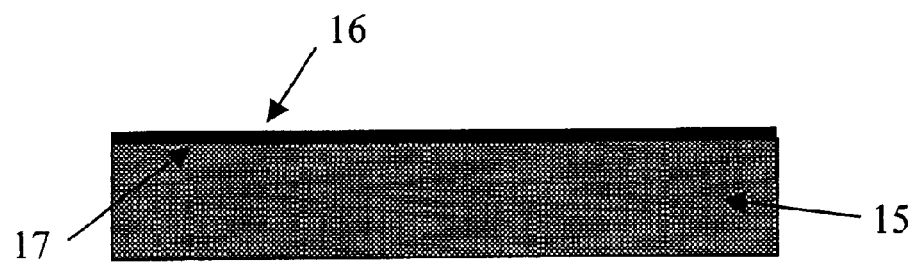
FIG. 10 shows a cross-sectional view of a third stamp embodying the present invention.

This aspect of the present invention is not limited to use with a stamp having raised regions on a stamping surface thereof, and may be used with planar stamps. FIG. 10 shows a planar third stamp 15 with a layer of polymer-stabilised catalytic particles 16 deposited on a stamping surface 17 thereof.

Figure 11:
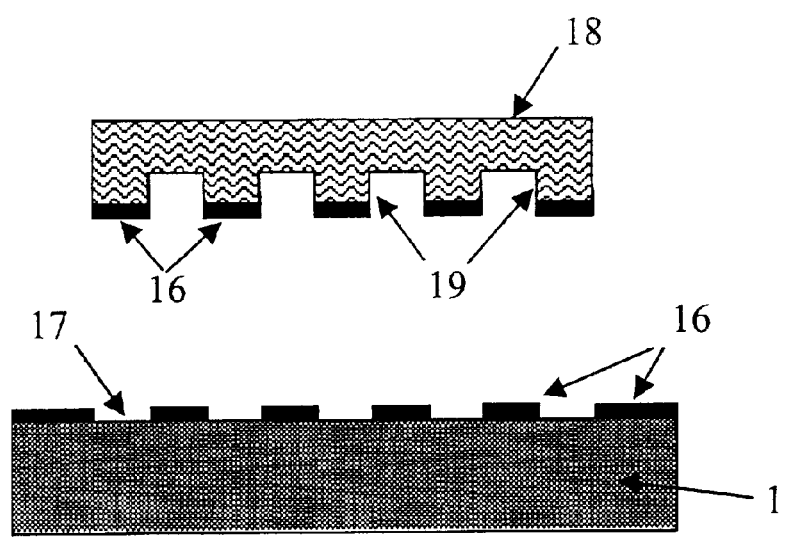
FIG. 11 shows a cross-sectional view of the stamp of FIG. 10 after application of an adhesive surface thereto.

An adhesive surface 18, having raised regions 19 thereon, is pressed against the stamping surface 17 of the third stamp 15 to selectively remove some of the polymer-stabilised catalytic particles 16 therefrom. In this embodiment of the invention, as will be seen below, the raised regions 19 of the adhesive surface 18 correspond to the gaps between metallic features that it is desired to form on a substrate. The adhesive surface 18 is removed from the stamping surface 16 of the third stamp 15, leaving polymer-stabilised catalytic particles 16 only on those regions of the stamping surface 17 of the third stamp that did not come into contact with the adhesive surface 18, i.e. those corresponding to the gaps between the raised regions 19 of the adhesive surface 18 as shown in FIG. 11.

Figure 12:
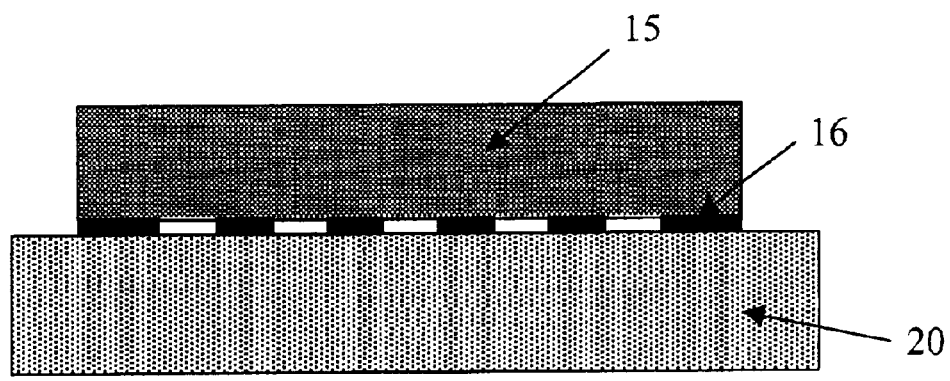
FIG. 12 shows a cross-sectional view of the stamp of FIG. 11 being applied to a third substrate.
Figure 13:
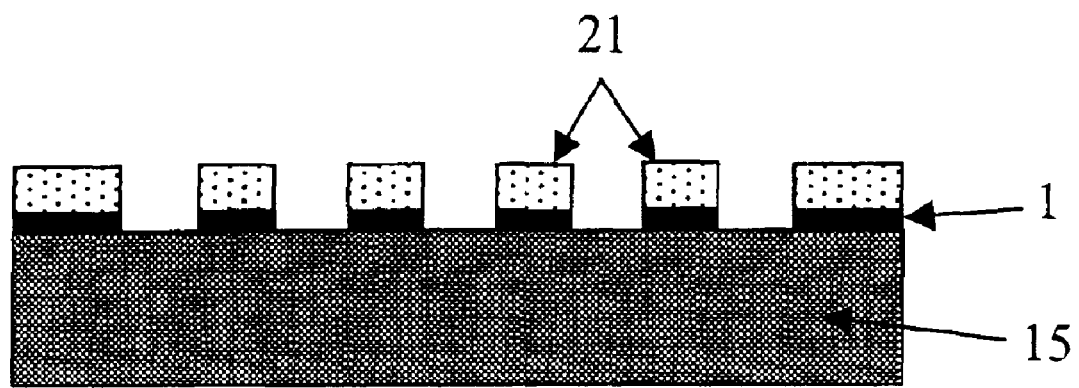
FIG. 13 shows the substrate of FIG. 13 following metalisation thereof.

The third stamp 15 is then applied to a planar third substrate 20, as shown in FIG. 12. In contrast to the above described embodiments, the pressing of third stamp 15 against the third substrate 20 does not create any significant indentations therein, as the stamping surface 17 of the third stamp 15 is substantially planar. As described above, the polymer-stabilised catalytic particles 16 will be transferred from the third stamp 15 to the third substrate 20. Following removal of the third stamp 15 from the third substrate 20, the third substrate 20 is electroless plated with a metal 21 resulting in metalisation of the third substrate 20 only in the regions thereof on which polymer-stabilised catalytic particles 16 have been deposited. (as shown in FIG. 13).

The above invention is not limited to use in the PCB, flexible circuit and packaging industries, and it is envisaged that the present invention could also be used to pattern magnetic features (such as nickel/cobalt alloys) onto disks to form patterned media disk drives. Alternatively, fine metal lines produced using the present invention could be used for optical or other gratings.

In the present specification "comprises" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

We claim:

1. A method of forming a metallic feature on a substrate, comprising the steps of:

providing a stamp having a raised region;

depositing catalytic particles on a selected area of the stamp, including the raised region thereof;

providing a substrate;

applying the stamp to the substrate, such that the raised region of the stamp causes a corresponding indented region in the substrate and at least some of the catalytic particles are transferred to a selected area of the substrate; and plating the selected area of the substrate.

2. A method according to claim 1, wherein the step of depositing catalytic particles on the selected area of the stamp comprises the step of immersing at least the selected area of the stamp in a suspension comprising the catalytic particles.

3. A method according to claim 2, wherein the step of immersing at least the selected area of the stamp in a suspension comprising the catalytic particles comprises the step of immersing at least the selected area of the stamp in an aqueous suspension comprising the catalytic particles.

4. A method according to claim 2, further comprising the step of drying at least the selected area of the stamp, after immersion thereof in the suspension.

5. A method according to claim 4, wherein the step of drying at least the selected area of the stamp comprises the step of blow drying at least the selected area of the stamp with a gas.

6. A method according to claim 5, wherein the step of blow drying at least the selected area with a gas comprises the step of blow drying the selected area with nitrogen, helium or air.

7. A method according to claim 4, wherein the step of depositing catalytic particles on the selected area of the stamp comprises the step of depositing polymer-stabilised catalytic particles on the selected area of the stamp.

8. A method according to claim 7, wherein the step of depositing polymer-stabilised catalytic particles on the selected area of the stamp comprises the step of depositing catalytic particles stabilised by polyvinylpyrrolidone, poly-2-vinylpyridine or polyvinyl alcohol on the selected area of the stamp.

9. A method according to claim 1, wherein the step of depositing catalytic particles on the selected area of the stamp comprises the step of depositing palladium-based catalytic particles on the selected area of the stamp.

10. A method according to claim 9, wherein the step of depositing catalytic particles on the selected area of the stamp comprises the step of depositing polymer-stabilised catalytic particles on the selected area of the stamp.

11. A method according to claim 10, wherein the step of depositing polymer-stabilised catalytic particles on the selected area of the stamp comprises the step of depositing catalytic particles stabilised by polyvinylpyrrolidone, poly-2-vinylpyridine or polyvinyl alcohol on the selected area of the stamp.

12. A method according to claim 1, wherein the step of providing a substrate comprises the step of providing a polymeric substrate.

13. A method according to claim 12, wherein the step of depositing catalytic particles on the selected area of the stamp comprises the step of immersing at least the selected area of the stamp in a suspension comprising the catalytic particles.

14. A method according to claim 13, further comprising the step of drying at least the selected area of the stamp, after immersion thereof in the suspension.

15. A method according to claim 12, wherein the step of providing a polymeric substrate comprises the step of providing a substrate formed from a polystyrene, a polyimide, an acrylic or an epoxy.

16. A method according to claim 1, wherein the step of applying the stamp to the substrate further comprises the step of heating at least one of the stamp or the substrate.

17. A method according to claim 16, wherein the step of heating at least one of the stamp or the substrate comprises the step of heating one of the stamp or the substrate to around or above the glass transition temperature of the substrate.

18. A method according to claim 1, further comprising the step of modifying at least the selected area of the substrate to facilitate the deposition of the catalytic particles thereon.

19. A method according to claim 18, wherein the step of modifying at least the selected area of the substrate comprises the step of chemically modifying the selected area of the substrate.

20. A method according to claim 1, further comprising the step of removing some of the catalytic particles from the stamp.

21. A method according to claim 20, wherein the step of removing some of the catalytic particles from the stamp comprises the steps of applying an adhesive surface to the stamp; and subsequently removing the adhesive surface from the stamp.

22. A method of forming a metallic feature on a substrate, comprising the steps of:
providing a stamp;
depositing catalytic particles on a selected area of the stamp;
providing a substrate;
heating at least one of the stamp or the substrate to around or above the glass transition temperature of the substrate;
applying the stamp to the substrate, such that at least some of the catalytic particles are transferred to a selected area of the substrate; and
plating the selected area of the substrate.

23. A method according to claim 22, wherein the step of depositing catalytic particles on the selected area of the stamp comprises the step of depositing polymer-stabilized catalytic particles on the selected area of the stamp.

24. A method according to claim 23, wherein the step of depositing polymer-stabilized catalytic particles on the selected area of the stamp comprises the step of depositing catalytic particles stabilized by polyvinylpyrrolidone, poly-2-vinylpyridine or polyvinyl alcohol on the selected area of the stamp.

25. A method according to claim 24, wherein the step of depositing catalytic particles on the selected area of the stamp comprises the step of immersing at least the selected area of the stamp in a suspension comprising the catalytic particles.

26. A method according to claim 25, wherein the step of immersing at least the selected area of the stamp in a suspension comprising the catalytic particles comprises the step of immersing at least the selected area of the stamp in an aqueous suspension comprising the catalytic particles.

27. A method according to claim 25, further comprising the step of drying at least the selected area of the stamp, after immersion thereof in the suspension.

28. A method according to claim 27, wherein the step of drying at least the selected area of the stamp comprises the step of blow drying at least the selected area of the stamp with a gas.

29. A method according to claim 28, wherein the step of blow drying at least the selected area with a gas comprises the step of blow drying the selected area with nitrogen, helium or air.

30. A method according to claim 22, wherein the step of depositing catalytic particles on the selected area of the stamp comprises the step of depositing palladium-based catalytic particles on the selected area of the stamp.

31. A method according to claim 22, wherein the step of providing a substrate comprises the step of providing a polymeric substrate.

32. A method according to claim 31, wherein the step of depositing catalytic particles on the selected area of the stamp comprises the step of immersing at least the selected area of the stamp in a suspension comprising the catalytic particles.

33. A method according to claim 32, further comprising the step of drying at least the selected area of the stamp, after immersion thereof in the suspension.

34. A method according to claim 31, wherein the step of providing a polymeric substrate comprises the step of providing a substrate formed from a polystyrene, a polyimide, an acrylic or an epoxy.

35. A method according to claim 22, further comprising the step of modifying at least the selected area of the substrate to facilitate the deposition of the catalytic particles thereon.

36. A method according to claim 35, wherein the step of modifying at least the selected area of the substrate comprises the step of chemically modifying the selected area of the substrate.

37. A method according to claim 22, further comprising the step of removing some of the catalytic particles from the stamp.

38. A method according to claim 37, wherein the step of removing some of the catalytic particles from the stamp comprises the steps of applying an adhesive surface to the stamp; and subsequently removing the adhesive surface from the stamp.

39. A method of forming a metallic feature on a substrate, comprising the steps of:
providing a stamp having a raised region;
depositing polymer-stabilized catalytic particles on a selected area of the stamp, including the raised region thereof;
providing a substrate;
applying the stamp to the substrate, such that the raised region of the stamp causes a corresponding indented region in the substrate and at least some of the catalytic particles are transferred to a selected area of the substrate; and plating the selected area of the substrate.

40. A method according to claim 39, wherein the step of depositing polymer-stabilized catalytic particles on the selected area of the stamp comprises the step of immersing at least the selected area of the stamp in a suspension comprising the catalytic particles.

41. A method according to claim 40, wherein the step of immersing at least the selected area of the stamp in a suspension comprising the catalytic particles comprises the step of immersing at least the selected area of the stamp in an aqueous suspension comprising the catalytic particles.

42. A method according to claim 39, further comprising the step of drying at least the selected area of the stamp, after said depositing.

43. A method according to claim 42, wherein the step of drying at least the selected area of the stamp comprises the step of blow drying at least the selected area of the stamp with a gas.

44. A method according to claim 43, wherein the step of blow drying at least the selected area with a gas comprises the step of blow drying the selected area with nitrogen, helium or air.

45. A method according to claim 39, wherein the step of depositing polymer-stabilized catalytic particles on the selected area of the stamp comprises the step of depositing catalytic particles stabilized by polyvinylpyrrolidone, poly-2-vinylpyridine or polyvinyl alcohol on the selected area of the stamp.

46. A method according to claim 39, wherein the step of depositing polymer-stabilized catalytic particles on the selected area of the stamp comprises the step of depositing palladium-based catalytic particles on the selected area of the stamp.

47. A method according to claim 39, wherein the step of providing a substrate comprises the step of providing a polymeric substrate.

48. A method according to claim 47, wherein the step of depositing catalytic particles on the selected area of the stamp comprises the step of immersing at least the selected area of the stamp in a suspension comprising the catalytic particles.

49. A method according to claim 48, further comprising the step of drying at least the selected area of the stamp, after immersion thereof in the suspension.

50. A method according to claim 47, wherein the step of providing a polymeric substrate comprises the step of providing a substrate formed from a polystyrene, a polyimide, an acrylic or an epoxy.

51. A method according to claim 39, wherein the step of applying the stamp to the substrate further comprises the step of heating at least one of the stamp or the substrate.

52. A method according to claim 51, wherein the step of heating at least one of the stamp or the substrate comprises the step of heating one of the stamp or the substrate to around or above the glass transition temperature of the substrate.

53. A method according to claim 39, further comprising the step of modifying at least the selected area of the substrate to facilitate the deposition of the polymer-stabilized catalytic particles thereon.

54. A method according to claim 53, wherein the step of modifying at least the selected area of the substrate comprises the step of chemically modifying the selected area of the substrate.

55. A method according to claim 39, further comprising the step of removing some of the catalytic particles from the stamp.

56. A method according to claim 55, wherein the step of removing some of the catalytic particles from the stamp comprises the steps of applying an adhesive surface to the stamp; and subsequently removing the adhesive surface from the stamp.

57. A method of forming a metallic feature on a substrate, comprising the steps of:

providing a stamp having a raised region;

depositing polymer-stabilized catalytic particles on a selected area of the stamp, including the raised region thereof, by immersing at least the selected area of the stamp in a suspension comprising the catalytic particles;

after immersion of the selected area of the stamp, drying at least the selected area of the stamp;

providing a polymeric substrate;

heating at least one of the stamp or the substrate;

applying the stamp to the substrate, such that the raised region of the stamp causes a corresponding indented region in the substrate and at least some of the catalytic particles are transferred to a selected area of the substrate; and plating the selected area of the substrate.

58. A method according to claim 57, wherein the step of depositing polymer-stabilized catalytic particles on the selected area of the stamp comprises the step of depositing catalytic particles stabilized by polyvinylpyrrolidone on the selected area of the stamp.

59. A method according to claim 57, wherein the step of depositing polymer-stabilized catalytic particles on the selected area of the stamp comprises the step of depositing catalytic particles stabilized by poly-2-vinylpyridine on the selected area of the stamp.

60. A method according to claim 57, wherein the step of depositing polymer-stabilized catalytic particles on the selected area of the stamp comprises the step of depositing catalytic particles stabilized by polyvinyl alcohol on the selected area of the stamp.

61. A method according to claim 57, wherein the step of depositing polymer-stabilized catalytic particles on the selected area of the stamp comprises the step of depositing palladium-based catalytic particles on the selected area of the stamp.

62. A method according to claim 57, further comprising the step of modifying at least the selected area of the substrate to facilitate the deposition of the polymer-stabilized catalytic particles thereon.

63. A method according to claim 62, wherein the step of modifying at least the selected area of the substrate comprises the step of chemically modifying the selected area of the substrate.

* * * * *